United States Patent [19]

Voegeli

[11] 4,340,942
[45] Jul. 20, 1982

[54] PERMALLOY-FIRST BUBBLE SWITCH

[75] Inventor: Otto Voegeli, Morgan Hill, Calif.

[73] Assignee: International Business Machines Corporation, Armonk, N.Y.

[21] Appl. No.: 211,599

[22] Filed: Dec. 1, 1980

[51] Int. Cl.$^3$ .............................................. G11C 19/08
[52] U.S. Cl. ........................................ 365/16; 365/39
[58] Field of Search ........................ 365/15, 16, 39, 43

[56] References Cited

U.S. PATENT DOCUMENTS 4,007,447  2/1977  Bobeck .................................. 365/43
4,172,758  11/1979 Bailey et al. ........................... 365/32
4,263,661  4/1981  Chen et al. ............................. 365/43

OTHER PUBLICATIONS

James L. Smith et al, "Dollar-Sign Transfer for Magnetic Bubbles" IEEE Transactions on Magnetics, vol. Mag-9, No. 3, Sep. 1973, pp. 285-289.
Reekstin et al, "Fabrication of 10$^4$ Bit Permalloy-First Magnetic Bubble Circuits on Epitaxial Garnet Chips", J. Vac. Sci. Technol., vol. 10, No. 5, Sep./Oct. 1973, pp. 845-851.
"The Design, Fabrication and Test of 16K Bubble Memory Chips" IEEE Transactions on Magnetics, vol. Mag-11, No. 5, Sep. 1975, pp. 1157-1159.
B. J. Roman et al, "Effect of Conductor Crossings on Propagation Margins" IEEE Transactions on Magnetics, vol. Mag-16, No. 3, May 1980, pp. 489-497.

Primary Examiner—James W. Moffitt
Attorney, Agent, or Firm—Joseph E. Kieninger

[57] ABSTRACT

A permalloy-first bubble switch has two curved propagation elements positioned on a layer of bubble domain supporting material. A curved conductor is superimposed on top of the propagation elements so that a current passing through the conductor element permits a bubble to be moved from one curved propagation element to the second curved propagation element.

10 Claims, 8 Drawing Figures

PERMALLOY-FIRST BUBBLE SWITCH

DESCRIPTION

1. Technical Field

This invention relates to bubble devices and more particularly to a bubble switching device.

It is a primary object of this invention to provide an improved bubble switching device.

It is a further object of this invention to provide a switch design allowing for device fabrication with improved lithographic resolution.

It is still another object of this invention to provide a switch design allowing for simplified device fabrication.

It is still another further object of this invention to provide a switch design having improved permalloy spacing characteristics.

It is a further object of this invention to provide a switch design having large operating margins.

It is yet still another object of this invention to provide a switch design allowing for device fabrication with increased storage density.

2. Background Art

The Smith et al article, page 285-289 of IEEE Transaction on Magnetics, Vol. Mag-9, No. 3 Sept. 1973 is a standard reference for the design of switches for magnetic bubbles. This article describes two distinct classes of switches, one class utilizing gradient transfer and the second class using blocking transfer. All bubble switches employ either gradient transfer, blocking transfer or a combination of these two transfer mechanisms.

Conventional bubble switches employ two levels of metallurgy. One level contains the permalloy propagation elements and the other level contains the current conductors, which may be made of aluminum-copper alloy, for example. The bubble industry has experimented with two types of permalloy/conductor arrangements. In one arrangement the current conductors are located on top of the permalloy elements. The associated device fabrication method is referred to as the permalloy-first process, since the permalloy layer is deposited on the bubble material first and the conductor layer is deposited second. In the other arrangement the current conductors are located between the bubble material and the permalloy elements. The associated fabrication method is referred to as the conductor-first process in that the conductor layer is deposited first and the permalloy layer is deposited second on top of the conductor layer.

Fabricating magnetic bubble devices using a permalloy-first process as well as a conductor-first process is described in the patent to Bailey et al, U.S. Pat. No. 4,172,758. These processes produce virtually vertical walls with a high degree of dimensional control of the composite pattern and permits fabrication of a substantially planar device. These processes have not been widely used in the industry due to various disadvantages of the processing and the structures obtained therefrom.

The fabrication of permalloy-first bubble devices is also described in the Reekstin et al article in the J. Vac. Sci. TECHNOL., Vol. 10 No. 5, Sept./Oct. 1973 pp 847 to 851 and in the Beck et al article in the IEEE Transactions on Magnetics, Vol. MAG-11, No. 5, Sept. 1975 pp 1157-1159. Permalloy-first and conductor-first processes are compared in a Reekstin et al article in the IEEE Transactions on Magnetics, Vol. MAG-9, No. 3, Sept. 1973. These articles convey that the permalloy-first approach has an ease of fabrication advantage since the permalloy pattern can be fabricated on a planar surface. However, bubble switches made by the permalloy-first process had generally poor operating margins and were inefficient, that is, require large switch currents compared to bubble switches of similar design with the conductor-first arrangement. This difference in performance characteristics is typical of the prior art switch designs. In these designs, the permalloy elements shunt the switching field from the conductor with the permalloy-first arrangement but enhance the switching field with the conductor-first arrangement.

It is primarily because of this inefficiency of the switches that the industry soon abandoned the permalloy-first approach in favor of the conductor-first approach. That is, bubble devices are now generally made with the conductor located between the bubble material and the permalloy propagation elements. This is in spite of so-called conductor crossing problems that are inherent to the conductor-first approach.

These problems arise because of the steps in the permalloy propagation elements where they cross the current conductor. The resulting uneven spacing between the bubble material and the permalloy causes a local variation of the magnetic bias field that impedes bubble propagation.

The conductor crossing problems become more serious as the storage density of a bubble device is increased as has been described by Roman et al in the IEEE Transactions on Magnetics, Vol. MAG-16, No. 3, May 1980. As is shown in this article, planarization of the permalloy and/or beveling of the conductor edges is required at higher storage densities with the conductor-first approach, making the device fabrication much more complex and expensive. As the conductor crossing problems can be alleviated only partially, however, the attainable storage density is limited with the conductor-first approach.

One conventional conductor-first bubble switch that is presently being used is shown in FIG. 1. The switch 8 includes the propagation element 10 which has end portions 12 and 14 and a stem portion 16. A conductor 18 is positioned under element 10, I-bar element 20 and C-bar 22. When there is no current in the conductor 18 a bubble on C-bar element 24 in minor loop 26 passes across I-bar 28 to the element end portion 12 and from there near stem 16 to end portion 14 and across I-bar 30 to the C-bar element 32. It is to be noted that the conductor 18 crosses the element 10 near the stem portion at a right angle to the normal track or path of the bubble as it is propagated. When the conductor is activated, the current produces a local Z field barrier across the normal track or path which prevents the bubble from traversing the switch element 10 from end 12 to end portion 14. The bubble is held at the barrier until, at some later phase, typically 90° or 180° of the rotating field, some adjacent element, in this case I-bar 20, becomes attracted and the bubble proceeds along the alternative track from element 10 to I-bar 20 and to C-bar 22 and then to the C-bar element 34 of major loop 36. The principle of operation for this type of switch clearly requires that the conductor 18 be located between the bubble layer (not shown) and the permalloy element 10 to avoid shunting of the conductor field by the element 10.

DISCLOSURE OF THE INVENTION

For a further understanding of the invention, and the objects and advantages thereof, reference will be had to the following description and the accompanying drawings, and to the appended claims in which the various novel features of the invention are more particularly set forth.

Accordingly, the invention comprises a permalloy-first bubble switch which has two curved propagation elements positioned on a layer of bubble domains supporting material. A curved conductor is superimposed on top of the propagation elements so that a current passing through the conductor element permits a bubble to be moved from one curved propagation element to the second curved propagation element. An example of a bubble switch in accordance with this invention would have a curved copper-aluminum conductor superimposed on top of two curved permalloy elements.

BEST MODE FOR CARRYING OUT THE INVENTION

Figure 1:
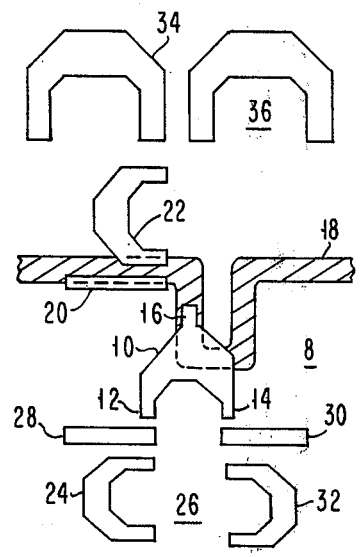
FIG. 1 is a top view of a conductor-first prior art switch.
Figure 2A:
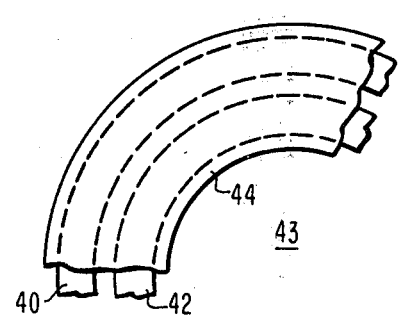
FIG. 2A is a top view of a permalloy-first switch in accordance with this invention.
Figure 2B:
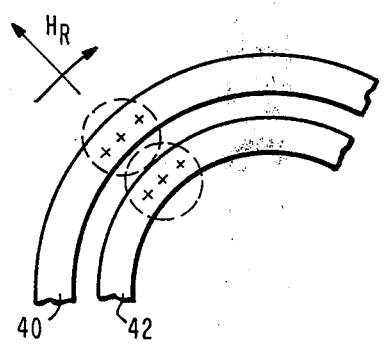
FIG. 2B illustrates the potential wells caused by the drive field $H_R$.
Figure 2C:
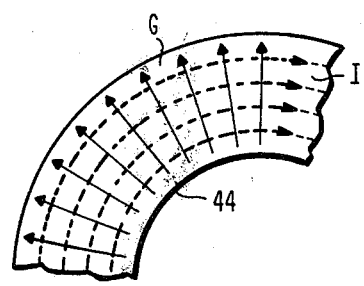
FIG. 2C illustrates the field gradient in the conductor.

A bubble switch in accordance with this invention is shown in FIG. 2A where curved propagation elements 40 and 42 are positioned on top of the bubble supporting substrate 43 and below a curved conductor 44 which runs parallel to the propagation elements of the normal and the alternative track. The pair of propagation elements 40 and 42 consist of two arcs in a roughly concentric position. As with C-bars, the propagation mechanism of these switch elements 40 and 42 results from their curvature so that we have two potential wells moving abreast with the field azimuth of the drive field $H_R$ along the concentric arcs as is indicated in FIG. 2B. When the switch is activated, the current, I, in the conductor produces a bias field gradient G, as shown in FIG. 2C perpendicular to the bubble propagation direction which causes the bubble to move from the well in the normal track to the adjacent well in the alternative track. The barrier between the two wells is determined by the spacing between the switch elements 40 and 42 which consequently determines the amplitude of the required switch current.

Conceptually the operation of the switch disclosed herein is different from the operation of prior art switches in that the bubble is switched between adjacent wells that exist simultaneously whereas in the prior art switches the bubble is switched between wells that occur sequentially.

While the switch described above is operated with the conductor located above the permalloy, the switch may also be operated with the conductor located below the permalloy level. The operability of the switch with the conductor located either above or below the permalloy level is possible because the two concentric switch elements provide for a continuous gap in the permalloy parallel to the current flow so that the permalloy does not shunt the field from the conductor whether it is located above or below the permalloy. Due to the problems referred to above in the prior art section regarding devices having the conductor located below the permalloy level, the preferred embodiment utilizes a conductor located on top of the permalloy, that is, a permalloy-first bubble switch.

Figure 3A:
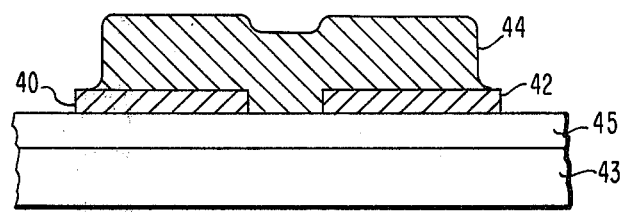
FIGS. 3A and 3B are cross-sectional views of two preferred embodiments.
Figure 3B:
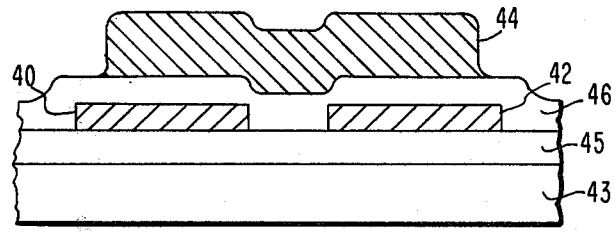

As shown in FIG. 3A, the conductor 44 and the propagation elements 40 and 42 are separated from the bubble material layer 43 by a spacer layer 45 which is a dielectric such as $SiO_2$. In another embodiment, as shown in FIG. 3B, there is a second spacer layer 46 which is a dielectric such as $SiO_2$ and which separates the conductor 44 from the propagation elements 40 and 42.

Figure 4:
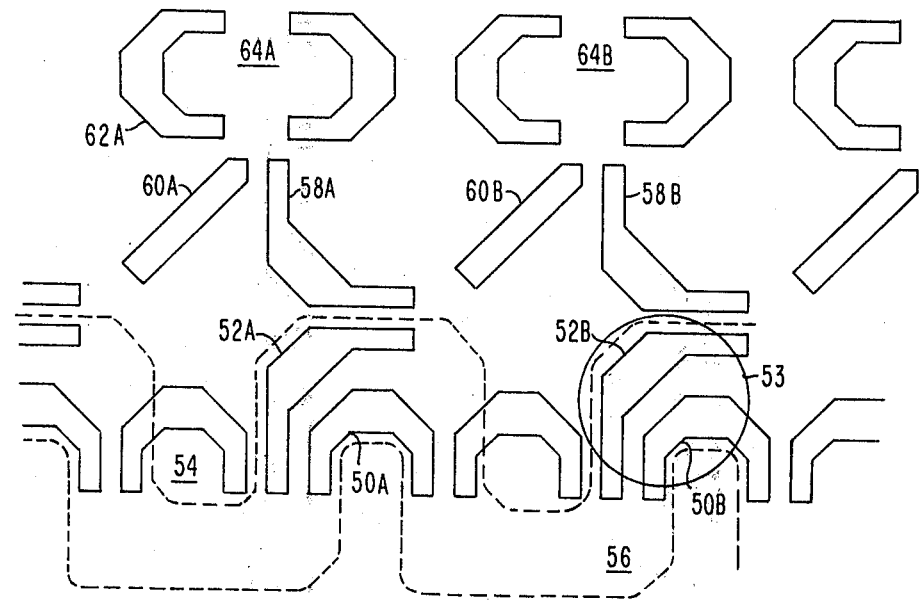
FIG. 4 is a top view of an input switch in accordance with this invention.

A transfer-in implementation of the permalloy-first switch is shown in FIG. 4. The switch consists of propagation elements 50 A, B and 52 A, B located in major loop 54. A conductor 56 is positioned over the switch elements 50 A,B and 52 A,B as shown. Bubbles propagating in a clockwise direction along major loop 54 will propagate around elements 50A and 50B is no current is passed through the conductor 56. However, if a current is passed through conductor 56 the bubble will pass from elements 50A and 50B to elements 52A and 52B and then to elements 58A and 58B to elements 60A and 60B and then to C-bar element 62A,B of minor loops 64A and 64B respectively. Depending on the phase of the current, switching can take place anywhere within the region designated by circle 53.

Figure 5:
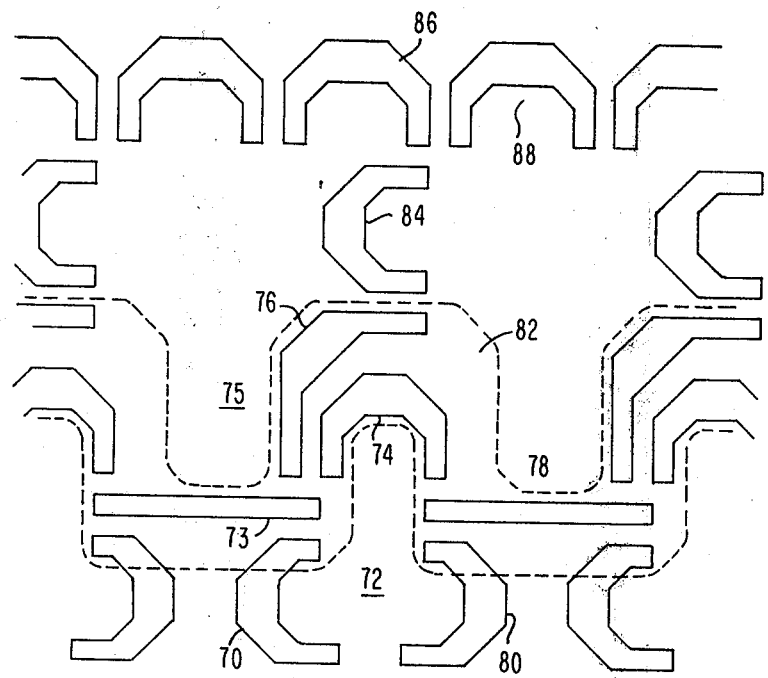
FIG. 5 is a top view of an output switch in accordance with this invention.

A transfer-out implementation of the permalloy-first switch is shown in FIG. 5. The switch 75 contains the propagation element 74 and the propagation element 76. A bubble on C-bar 70 of minor loop 72 will propagate along the end of I-bar 73 to element 74 and then to I-bar 78 and then to C-bar 80 when no current is passed through the conductor 82. When a current is passed through the conductor 82, a bubble on switch element 74 will pass to element 76 and then to C-bar element 84 and then to C-bar element 86 in the major loop 88.

The described switch design has been formed to work efficiently with a permalloy-first device structure. It thus allows for the permalloy pattern, which is the pattern requiring highest lithographic resolution, to be fabricated onto a planar surface. Devices having higher storage density can thus be fabricated with the improved planar resolution capability.

The permalloy-first approach greatly simplifies device fabrication. Since the permalloy propagation elements do not cross over the conductors, there are no step coverage problems as with the conductor-first approach and the cross-sectional profile of the conductor is immaterial. The use of additional processing steps for conductor bevelling and for planarization of the permalloy substrate has been eliminated.

With the conductor-first approach, the usable conductor thickness is quite restricted because of limits in the allowable step height of propagation elements crossing the conductor. Also, the more intricate conductor patterns of the prior art switch designs dictate the use of comparatively narrow conductors. The conductor cross section is thus quite small with these prior art designs. Limitations in the current carrying capacity of these small conductors makes the fabrication of devices having a higher storage density problematic. The switches of this invention on the other hand, use much wider conductors and with the permalloy-first approach there are no restrictions to the usable conductor thickness. The switch designs of this invention hence use a conductor cross section which typically is about ten times the cross section of prior art switches and extendability of storage density is improved accordingly.

Since there are no steps in the permalloy propagation elements in the devices of this invention, there is no associated variation of bias field which, in the prior art conductor-first devices produces a similar reduction in bias field. The switches of this invention thus exhibit large operating margins. The switches of this invention also exhibit large margins in the phase and amplitude of the switch current since the exact mode of switching is immaterial to the operation of the device.

While I have illustrated and described the preferred embodiments of my invention it is understood that I do not limit myself to the precise construction herein disclosed, and the right is reserved to all changes and modifications coming within the scope of the invention, as described in the attendant claims.

I claim:

1. A bubble switching device comprising:
   a first layer of bubble domain supporting material,
   a spacer layer on said first layer,
   a first propagation element superimposed on said spacer layer, said first element having a substantially curved portion,
   a second propagation element superimposed on said first layer, said second element having a substantially curved portion that is in spaced relation with and substantially concentric with said first element curved portion, and
   a conductor element superimposed on said first and second propagation elements, said conductor element having a substantially curved portion concentric with said first and second element curved portions wherein passing current through said conductor element permits a bubble in said first layer to be moved from under said first element curved portion to under said second element curved portion.

2. A device as described in claim 1 wherein said first element is a C-bar.

3. A device as described in claim 1 wherein said second element is a L-bar.

4. A device as described in claim 1 including a second spacer layer positioned between said conductor element and said first and second propagation elements.

5. A device as described in claim 1 wherein the width of said conductor element is substantially equal to the separation between the outer edges of said first and second propagation elements.

6. The combination of a major loop including an array of devices as described in claim 1 wherein said conductor elements are connected in series.

7. The combination of a major loop including an array of devices as described in claim 1 wherein said devices are separated by C-Bar propagation elements.

8. The combination of a minor loop array and a device as described in claim 1 associated with each minor loop in said array.

9. The combination including a device as described in claim 1, a first propagation element for moving bubbles to said device, and a second and third propagation elements for moving bubbles away from said device.

10. The combination as described in claim 9 wherein said first, second and third propagation elements are taken from the group consisting of C-Bars, I-Bars and L-bars.

* * * * *